US010832893B2

(12) United States Patent
McClelland et al.

(10) Patent No.: US 10,832,893 B2
(45) Date of Patent: Nov. 10, 2020

(54) PLASMA REACTOR FOR PROCESSING GAS

(71) Applicant: ReCarbon, Inc., Santa Clara, CA (US)

(72) Inventors: Stefan Andrew McClelland, San Jose, CA (US); George Stephen Leonard, III, Oakland, CA (US); Jae Mo Koo, Palo Alto, CA (US)

(73) Assignee: RECARBON, INC., Santa Clara, CA (US)

( * ) Notice: Subject to any disclaimer, the term of this patent is extended or adjusted under 35 U.S.C. 154(b) by 0 days.

(21) Appl. No.: 16/752,689

(22) Filed: Jan. 26, 2020

(65) Prior Publication Data
US 2020/0312627 A1    Oct. 1, 2020

Related U.S. Application Data

(60) Provisional application No. 62/823,436, filed on Mar. 25, 2019, provisional application No. 62/823,492, filed on Mar. 25, 2019, provisional application No. 62/823,505, filed on Mar. 25, 2019, provisional application No. 62/823,508, filed on Mar. 25, 2019, provisional application No. 62/823,514, filed on Mar. 25, 2019, provisional application No. 62/823,517, filed on Mar. 25, 2019, provisional application No. 62/823,484, filed on Mar. 25, 2019.

(51) Int. Cl.
*H01J 37/32* (2006.01)

(52) U.S. Cl.
CPC .... *H01J 37/32229* (2013.01); *H01J 37/3244* (2013.01); *H01J 37/32623* (2013.01); *H01J 2237/1502* (2013.01)

(58) Field of Classification Search
CPC ........... H01J 37/32201; H01J 37/32192; H01J 37/32357; H01J 37/32449
USPC ..................................................... 315/111.21
See application file for complete search history.

(56) References Cited

U.S. PATENT DOCUMENTS 5,418,430 A * 5/1995 Bayliss ............. H01J 37/32009
                                                                    313/231.31
9,275,839 B2    3/2016 Chen et al.
(Continued)

FOREIGN PATENT DOCUMENTS

| KR | 10-2017-0006007 A | 1/2017 |
| KR | 10-2018-0114614 A | 10/2018 |
| WO | 2010-005201 A3 | 1/2010 |

*Primary Examiner* — Tung X Le
(74) *Attorney, Agent, or Firm* — Patent Office of Chung Park (57) ABSTRACT

The present invention provides a plasma generating system that includes: a waveguide for transmitting a microwave energy therethrough; an inner wall disposed within the waveguide to define a plasma cavity, wherein a plasma is generated within the plasma cavity using the microwave energy; a first gas inlet mounted on a first side of the waveguide and configured to introduce a first gas into the plasma cavity and generate a first vortex flow within the plasma cavity using the first gas, the first gas inlet having a through hole through which a gas processed by the plasma exits the plasma cavity; and a plasma stabilizer having a shape of a circular hollow cylinder and installed on a second side of the waveguide, an axial direction of the plasma stabilizer being in parallel to a rotational axis of the first vortex flow.

20 Claims, 8 Drawing Sheets

(56) References Cited

U.S. PATENT DOCUMENTS

| | | | | |
|---|---|---|---|---|
| 2004/0173316 A1* | 9/2004 | Carr | .................. | C23C 16/511 |
| | | | | 156/345.41 |
| 2008/0017616 A1 | 1/2008 | Lee | | |
| 2009/0272653 A1* | 11/2009 | Beech | ................ | B01J 19/126 |
| | | | | 205/343 |
| 2011/0115378 A1 | 5/2011 | Lubomirsky | | |
| 2011/0250098 A1* | 10/2011 | Matveev | ............... | F23C 3/006 |
| | | | | 422/186.03 |
| 2012/0315745 A1* | 12/2012 | Katayama | ............. | C23C 16/24 |
| | | | | 438/488 |
| 2014/0142255 A1* | 5/2014 | Paulauskas | ............ | D01F 9/22 |
| | | | | 525/388 |
| 2014/0159572 A1* | 6/2014 | Risby | ............... | H01J 37/32449 |
| | | | | 315/39.51 |
| 2019/0006151 A1* | 1/2019 | Paukner | .......... | H01J 37/32449 |

\* cited by examiner

PLASMA REACTOR FOR PROCESSING GAS

CROSS-REFERENCE TO PRIOR APPLICATIONS

This application claims priority of U.S. Patent Application Nos. 62/823,436; 62/823,492; 62/823,505; 62/823,508; 62/823,514; 62/823,517; 62/823,472; 62/823,484; 62/823,855; 62/870,605, which are hereby incorporated by reference in their entirety.

BACKGROUND OF THE INVENTION

1. Field of the Invention

The present invention relates to plasma generators, and more particularly to devices for processing gas using microwave plasma.

2. Discussion of the Related Art

In recent years, microwave technology has been applied to generate various types of plasma. Typically, a microwave discharge, which is used as a plasma source, is achieved by coupling microwave energy into a discharge chamber containing gas to be processed. One of the difficulties in operating a conventional microwave plasma system includes sustaining plasma in a stable manner. Unstable plasma, as a result of suboptimal reactor geometry, gas inlet manifolds, chamber design, or gas flow rate, etc. may cause less than optimal condition for gas processing or reformation and may even cause the plasma to extinguish itself or damage the reactor.

As such, there is a need for microwave plasma system that has an improved plasma stability to thereby yield a higher efficiency reactor and throughput for better economics.

SUMMARY OF THE INVENTION

According to one aspect of the present invention, a plasma generating system that includes: a waveguide for transmitting a microwave energy therethrough; an inner wall disposed within the waveguide to define a plasma cavity, wherein a plasma is generated within the plasma cavity using the microwave energy; a first gas inlet mounted on a first side of the waveguide and configured to introduce a first gas into the plasma cavity and generate a first vortex flow within the plasma cavity using the first gas, the first gas inlet having a through hole through which a gas processed by the plasma exits the plasma cavity; and a plasma stabilizer having a shape of a circular hollow cylinder and installed on a second side of the waveguide, an axial direction of the plasma stabilizer being in parallel to a rotational axis of the first vortex flow.

According to another aspect of the present invention, a plasma generating system includes: a waveguide for transmitting a microwave energy therethrough; an inner wall disposed within the waveguide to define a plasma cavity, wherein a plasma is generated within the plasma cavity using the microwave energy; a first gas inlet mounted on a first side of the waveguide and configured to introduce a first gas into the plasma cavity and generate a first vortex flow within the plasma cavity using the first gas, the first gas inlet having a through hole through which a gas processed by the plasma exits the plasma cavity; and a plasma stabilizer having a shape of a circular hollow cylinder and installed on the first gas inlet, an axial direction of the plasma stabilizer being in parallel to a rotational axis of the first vortex flow.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

Figure 1:
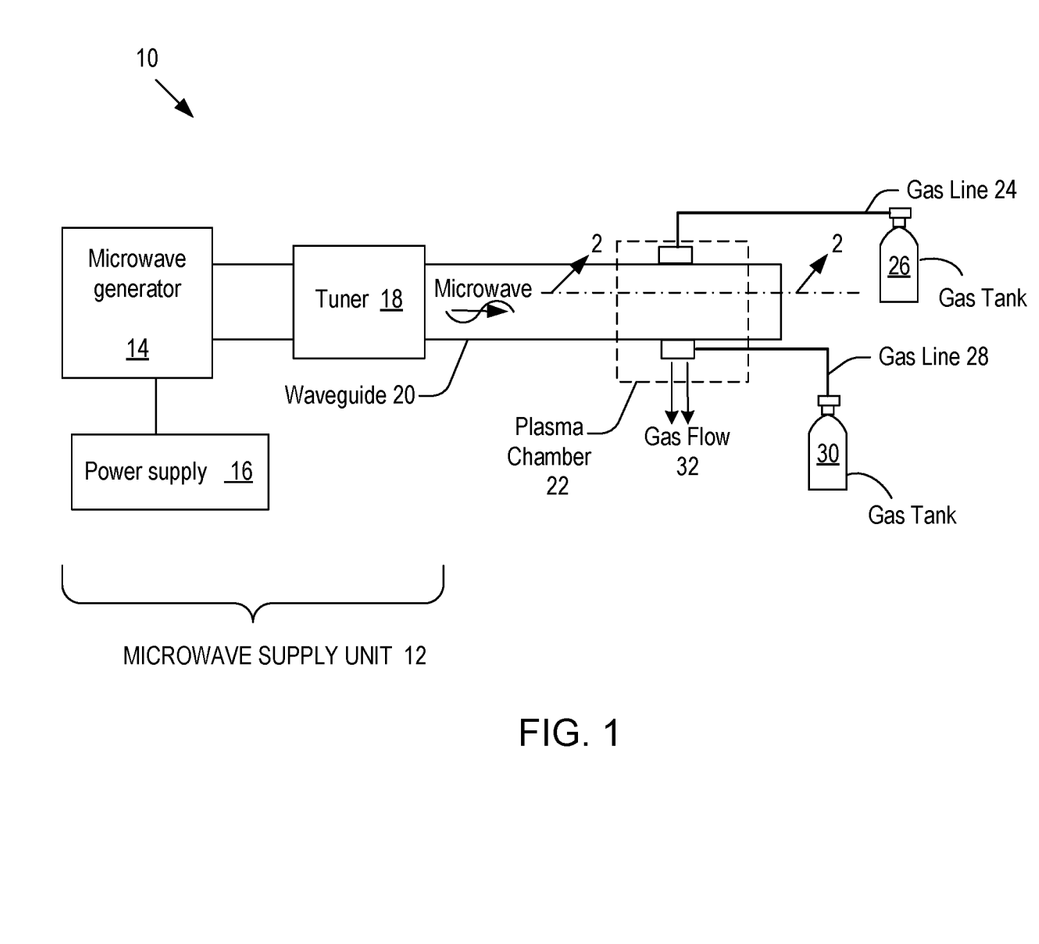
FIG. 1 ("FIG. 1") shows a schematic diagram of a plasma generating system according to embodiments of the present disclosure.

FIG. 1 ("FIG. 1") shows a schematic diagram of a plasma generating system 10 according to embodiments of the present disclosure. As depicted, the plasma generating system 10 includes: a microwave cavity/waveguide 20 having a shape of a hollow tube; a plasma chamber 22 connected to the waveguide 20; and a microwave supply unit 12 connected to the waveguide 20 and operative to provide microwave energy to the plasma chamber 22 via a microwave waveguide 20. In embodiments, the plasma chamber 22 receives the microwave energy and processes gas by use of the received microwave energy. In embodiments, a gas tank 26 provides gas to the plasma chamber 22 via a gas line 24, and a gas tank 30 provides gas to the plasma chamber 22 via a gas line 28.

The microwave supply unit 12 provides microwave energy to the plasma chamber 22 and includes: a microwave generator 14 for generating microwaves; a power supply 16 for supplying power to the microwave generator 14; and a tuner 18 for reducing the microwave energy reflected from the plasma chamber 22 and travelling toward the microwave generator 14. In embodiments, the microwave supply unit 12 may include other components, such as an isolator having a dummy load for dissipating reflected microwave energy that propagates toward the microwave generator 14 and a circulator for directing the reflected microwave energy to the dummy load and a sliding short circuit disposed at the end of the waveguide 20.

Figure 2:
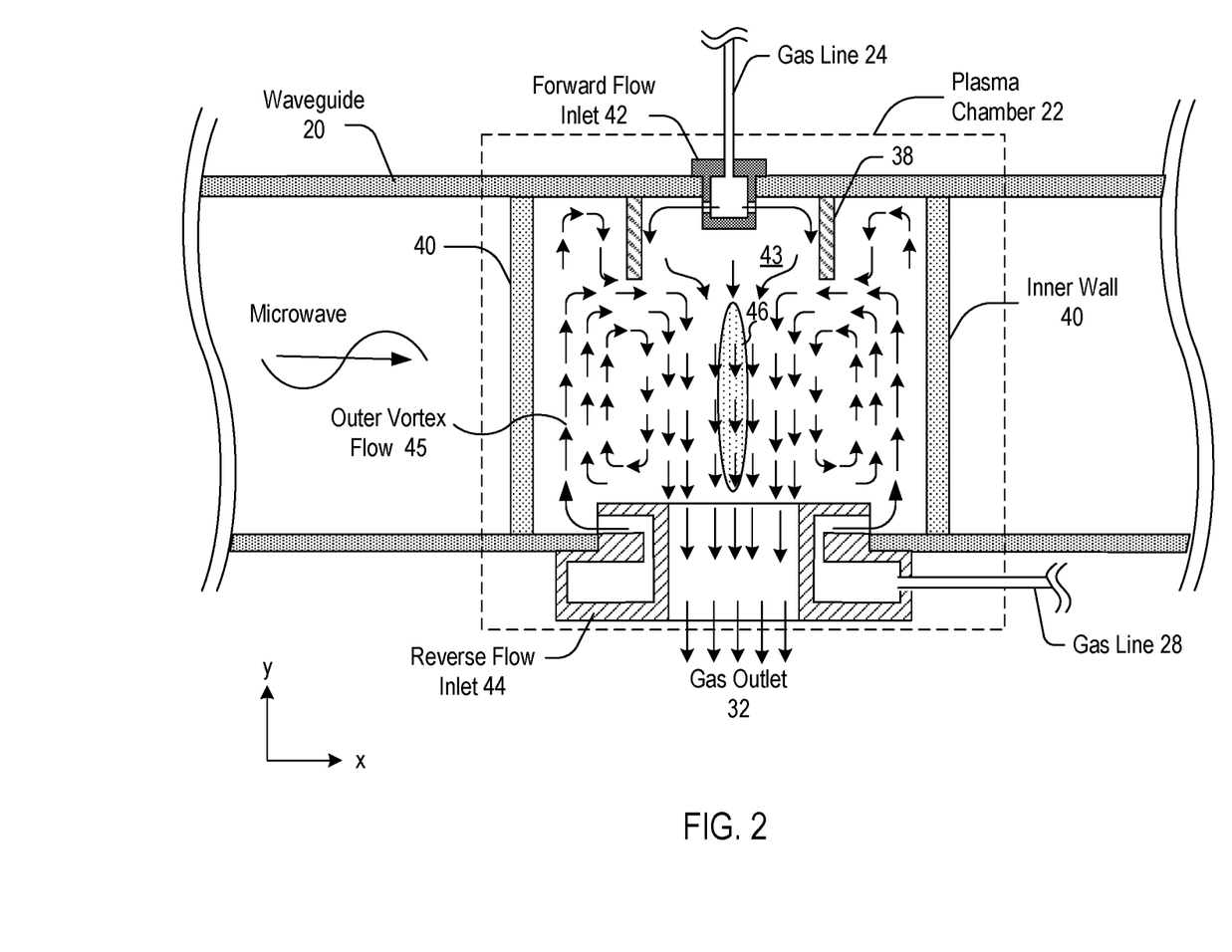
FIG. 2 shows a cross sectional view of a plasma chamber in FIG. 1, taken along the line 2-2, according to embodiments of the present disclosure.

FIG. 2 shows a cross sectional view of a plasma chamber 22 in FIG. 1, taken along the line 2-2 (i.e. cut along a plane parallel to the paper), according to embodiments of the present disclosure. As depicted, the plasma chamber 22 includes: an inner wall(s) 40; a plasma stabilizer 38; a forward flow inlet 42 connected to the gas line 24 and configured to introduce the forward flow into the plasma chamber; and a reverse flow inlet 44 connected to the gas line 28 and configured to introduce the reverse flow into the plasma chamber. Here, the term plasma cavity refers to the enclosed space that is surrounded by the inner wall 40, waveguide 20, forward flow inlet 42 and reverse flow inlet 44, where the reverse flow gas and forward flows are processed/reformed in the plasma cavity by the microwave energy transmitted via the waveguide 20.

In embodiments, the inner wall 40 is formed of a material that is transparent to the microwave energy, such as quartz or ceramic. In embodiments, the inner wall 40 is formed of any other suitable dielectric material that is desirable for uniform flow, thermal resistance, chemical resistance, and electromagnetic transparency. In embodiments, the inner wall 40 has preferably, but not limited to, a shape of hollow circular cylinder.

Figure 3:
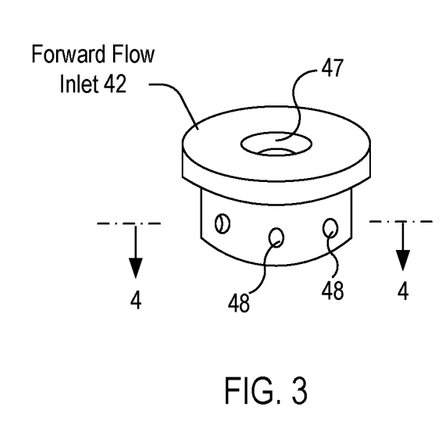
FIG. 3 shows a perspective view of a forward flow inlet according to embodiments of the present disclosure.
Figure 4:
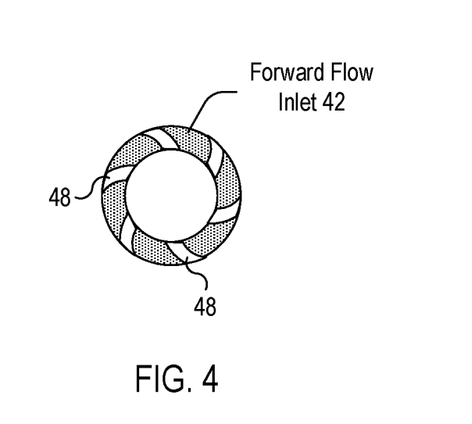
FIG. 4 shows a cross sectional view of the forward flow inlet in FIG. 3, taken along the line 4-4, according to embodiments of the present disclosure.

FIG. 3 shows a perspective view of the forward flow inlet 42 according to embodiments of the present disclosure. FIG. 4 shows a cross sectional view of the forward flow inlet 42, taken along the line 4-4, according to embodiments of the present disclosure. As depicted, the forward flow inlet 42 has a hole/adaptor 47 for coupling to the gas line 24 and one or more gas passageways 48 that are formed in the wall thereof. In embodiments, the exits of the gas passageways 48 are located inside the plasma stabilizer 38 so that the plasma stabilizer 38 forms an inner vortex flow 43 using the flow exiting the gas passageways 48. In embodiments, the inner diameter of the plasma stabilizer 38 may be varied to adjust the outer diameter of the inner vortex flow 43. In embodiments, as discussed above, the plasma stabilizer 38 may have a shape of hollow circular cylinder and disposed concentrically to the forward flow inlet 42.

In embodiments, each gas passageway 48 is arranged to impart spiral motion to the forward flow as the forward flow enters the plasma cavity via the gas passageway 48. In embodiments, each gas passageway 48 may be curved to enhance the vorticity of the forward flow. In embodiments, the forward flow inlet 42 is formed of any suitable material, such as ceramic, so that the inlet is electrically isolated from the waveguide 20 and withstand the heat energy from the plasma 46.

Figure 7:
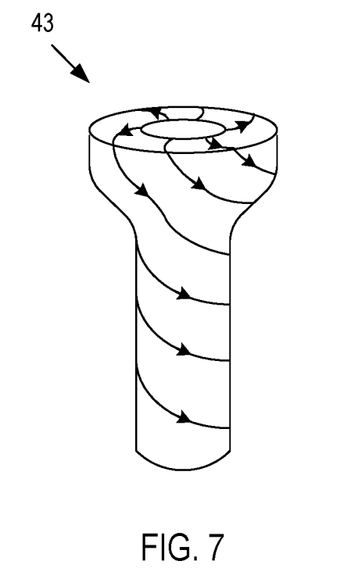
FIG. 7 shows a perspective view of an inner vortex flow according to embodiments of the present disclosure.

In embodiments, the plasma stabilizer 38 is formed of material that is transparent to the microwave energy, and preferably formed of the same material as the inner wall 40. In embodiments, the plasma stabilizer 38 is attached to the waveguide 20, protruding into the plasma cavity, where the axial direction of the plasma stabilizer 38 is parallel to the y-axis. In embodiments, as discussed above, the inner wall 40 may have a shape of a hollow circular cylinder and the plasma stabilizer 38 may be installed concentrically to the inner wall 40. In embodiments, the forward flow inside the plasma stabilizer 38 forms the inner vortex flow 43 and proceeds toward the other end of the waveguide 20, more specifically toward the gas outlet 32. FIG. 7 shows a perspective view of the inner vortex flow 43 according to embodiments of the present disclosure. As depicted, the forward flow (or equivalently, inner vortex flow) travels the length of the inner wall 40 in a helical motion until the inner vortex flow exits the gas outlet 32.

In embodiments, upon ignition of a plasma plume (or shortly, plasma) 46 by a plasma igniter (not shown in FIG. 2), the plasma 46 is sustained by the microwave energy transmitted by the microwave generator 14. In embodiments, the plasma 46 is located within the inner vortex flow 43 so that the gas particles of the inner vortex flow 43 pass through the plasma 46. In embodiments, the plasma stabilizer 38 determines the outer diameter of the inner vortex flow 43, preventing the forward flow from bypassing the plasma 46 before exiting the plasma cavity through the gas outlet 32. In embodiments, the plasma stabilizer 38 aids in keeping the plasma 46 stable by separating the inner vortex flow 43 from the outer vortex flow 45.

Figure 5:
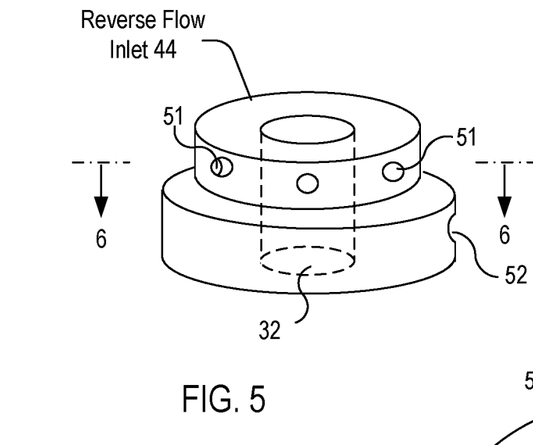
FIG. 5 shows a perspective view of a reverse flow inlet according to embodiments of the present disclosure.
Figure 6:
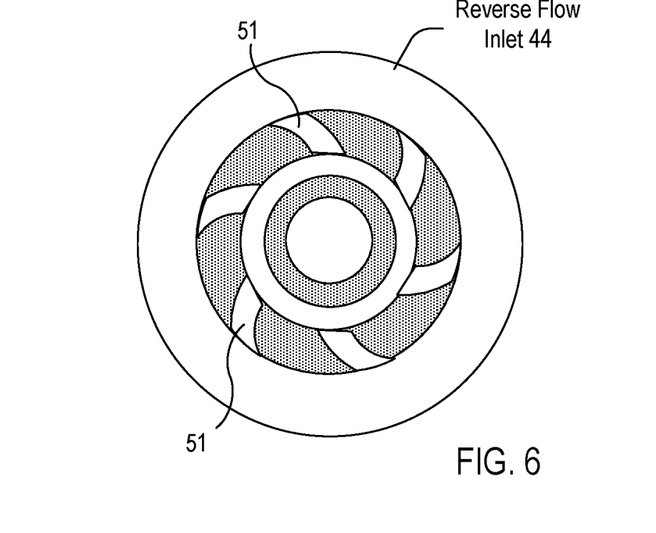
FIG. 6 shows a cross sectional view of the reverse flow inlet in FIG. 5, taken along the line 6-6, according to embodiments of the present disclosure.

FIG. 5 shows a perspective view of the reverse flow inlet 44 according to embodiments of the present disclosure. FIG. 6 shows a cross sectional view of the reverse flow inlet 44, taken along the line 6-6, according to embodiments of the present disclosure. As depicted, the reverse flow inlet 44 has a hole/adaptor 52 for coupling to the gas line 28, a through hole to form the gas outlet 32, and one or more gas passageways 51 that are formed in the wall thereof. In embodiments, each gas passageway 51 is arranged to impart spiral motion to the reverse flow as the reverse flow enters the plasma cavity via the gas passageway 51. In embodiments, each gas passageway 51 may be curved to enhance the vorticity of the reverse flow. In embodiments, the reverse flow inlet 44 is formed of preferably, but not limited to, Ni alloy, such as Inconel or Hastelloy.

In embodiments, the reverse flow exiting the reverse flow inlet 44 travels toward to the inner wall 40 and then proceeds upwardly (y-axis direction) toward the other end of the waveguide 20 along the inner wall 40 in a helical motion.

Figure 8:
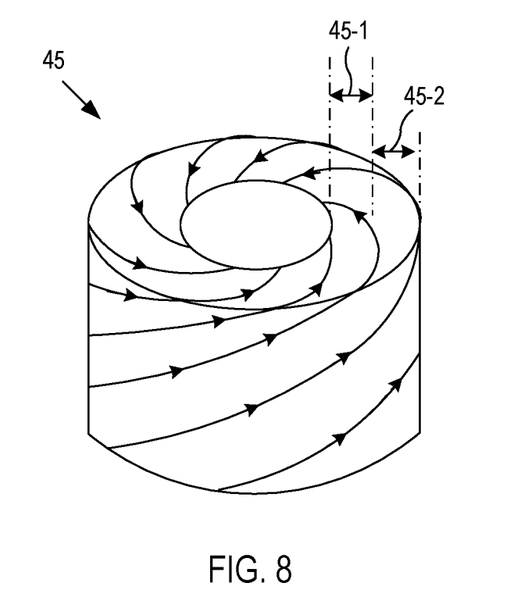
FIG. 8 shows a perspective view of an outer vortex flow according to embodiments of the present disclosure.

Subsequently, the reverse flow reverses the flow direction to proceed downwardly and form an outer vortex flow 45. In embodiments, the rotational axis of the outer vortex flow 45 is substantially parallel to the y-axis. FIG. 8 shows a perspective view of the outer vortex flow 45 according to embodiments of the present disclosure. As depicted, the outer vortex flow 45 has a hollow cylinder shape and has two flow regions: inner downward flow region 45-1 and an outer upward flow region 45-2. In embodiments, the inner vortex flow 43 is disposed in the middle hollow portion of the outer vortex flow 45 and surrounded by inner downward flow region 45-1. It is noted that the gas from the forward flow inlet 42 is mixed with the flow from the reverse flow inlet 44 to form the inner vortex flow 43.

In embodiments, the outer vortex flow 45 surrounds the inner vortex flow 43, to thereby shield the inner wall 40 from the plasma 46. In embodiments, the reverse flow exiting the reverse flow inlet 44 may have the ambient temperature and take heat energy from the inner wall 40 as the outer vortex flow 45 travels upwardly along the inner wall 40 in the helical motion.

In embodiments, as discussed above, the inner diameter of the plasma stabilizer 38 determines the radial dimension of the inner vortex flow 43. As such, in embodiments, the inner diameter of the plasma stabilizer 38 may be adjusted so that the outer vortex flow 45 surrounds the inner vortex flow 43 and maintain the flow regime of the inner vortex flow 43 in a stable manner to thereby stabilize the plasma and yield improved throughput and efficiency.

In embodiments, the plasma 46 is used to reform the inlet gas to the desired product gas, where the inlet gas is introduced into the plasma cavity by the forward flow inlet 42 and reverse flow inlet 44. In embodiments, the gas composition of the inner vortex flow exiting the forward flow inlet 42 includes $CO_2$, $CH_4$ and $O_2$, and the gas exiting the gas outlet 32 includes $CO$ and $H_2$ as well as a non-reacted portion of forward flow gas. In embodiments, the preferred distribution for the forward flow is 5%-95% by mass of the total flow into the plasma chamber 22. In embodiments, the reverse flow may have the same gas composition of the forward flow. In alternative embodiments, the forward flow may have different gas composition from the reverse flow. Also, the gas composition of the forward flow (and/or reverse flow) may be changed during operation. For instance, the forward flow may include a slug of argon to aid ignition of the plasma 46. In embodiments, the gas compositions and flow rates of the forward and reverse flows may be adjusted to enhance the plasma stability and efficiency of the chemical reaction in the plasma chamber 22.

Figure 9:
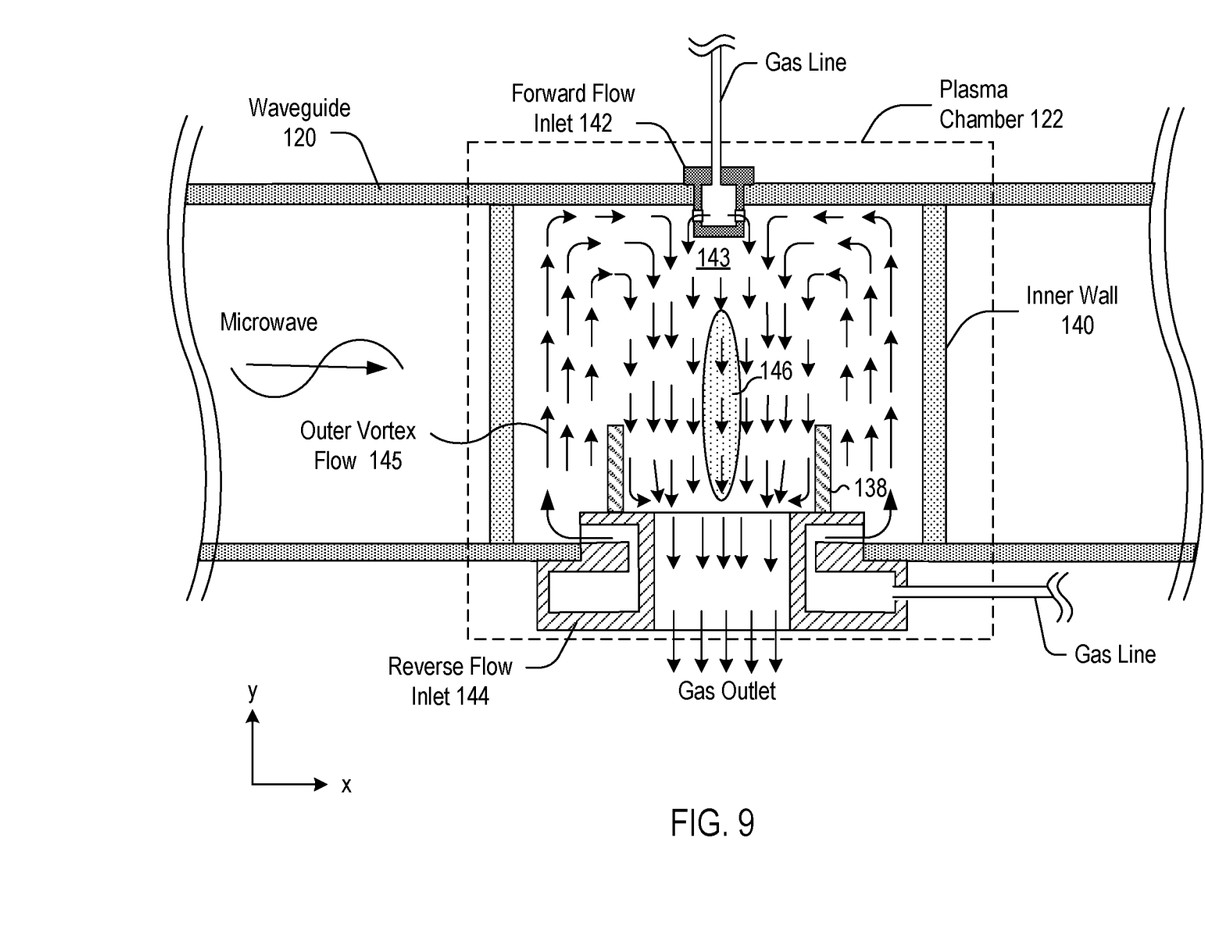
FIG. 9 shows a cross sectional view of a plasma chamber according to embodiments of the present disclosure.

FIG. 9 shows a cross sectional view of a plasma chamber 122 according to embodiments of the present disclosure. As depicted, the plasma chamber 122 is similar to the plasma chamber 22 in FIG. 2, with the difference that the plasma stabilizer 138 is disposed on the reverse flow inlet 144, protruding into the plasma cavity. In embodiments, the plasma stabilizer 138 is located inside the outer vortex flow 145, and preferably separates the inner upward flow region (similar to 45-1) of the outer vortex flow 143 from the outer downward flow region (similar to 45-2) of the outer vortex flow 143, i.e., the plasma stabilizer 138 is located at the boundary between the inner and outer flow regions of the outer vortex flow 143.

Figure 10:
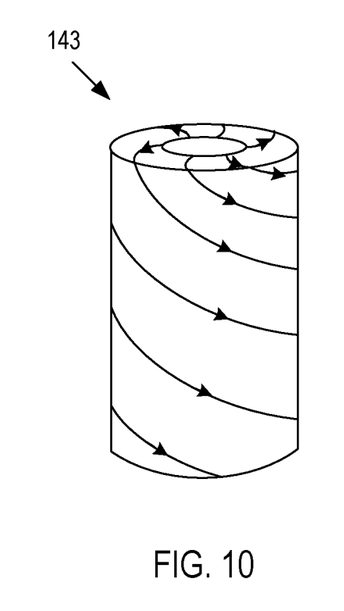
FIG. 10 shows a perspective view of an inner vortex flow according to embodiments of the present disclosure.

As depicted, the components of the plasma chamber 122 include: inner wall 140; waveguide 120; forward flow inlet 142 and reverse flow inlet 144, where these components have the similar structures and functions of their counterparts, respectively. Unlike in the plasma chamber 22, the radial dimension of the forward flow is not controlled by the inner diameter of the plasma stabilizer 138; instead, the radial dimension of the inner vortex flow 143 is determined by the flow rate of the forward flow exiting the forward flow inlet 142. Thus, as shown in FIG. 10, the inner vortex flow inlet 143 may have a substantially uniform radial dimension along the longitudinal direction (y-axis). In embodiments, the outer vortex flow 145 has the similar geometry as the outer vortex flow 45 in FIG. 8.

In embodiments, the plasma stabilizer 138 is located inside the outer vortex flow 145 and suppresses the fluctuation of the radial dimension of the inner upward flow region (similar to 45-1) of the outer vortex flow 145 during operation, to thereby stabilize the overall flow regime of the inner vortex flow 143 and, in turn, stabilize the plasma 146.

Figure 11:
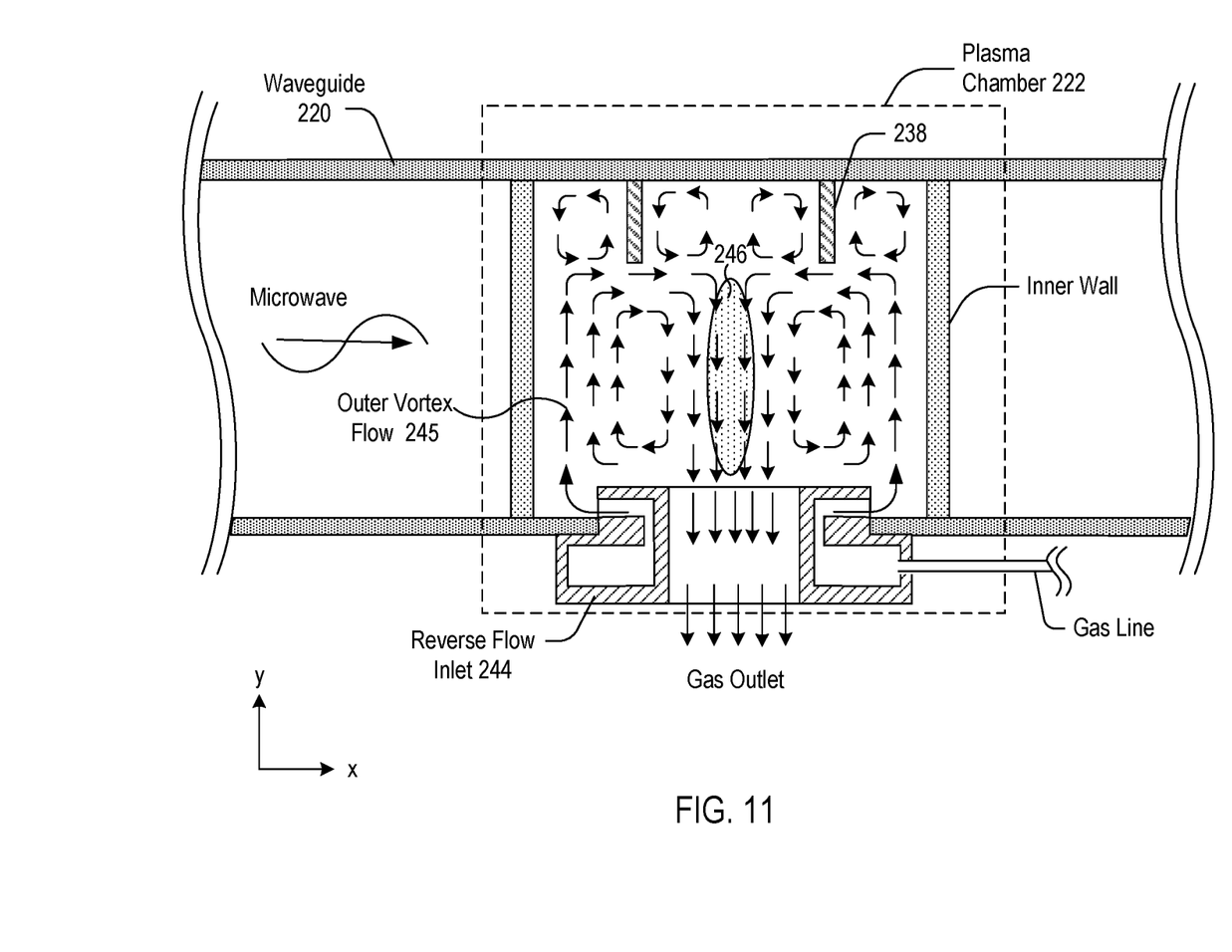
FIG. 11 shows a cross sectional view of a plasma chamber according to embodiments of the present disclosure.
Figure 12:
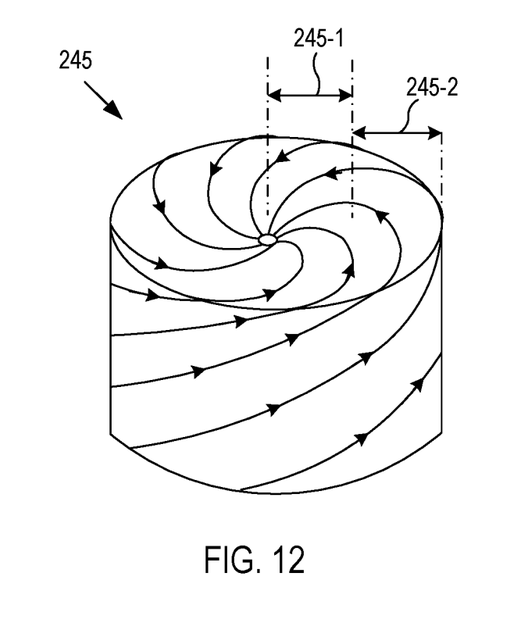
FIG. 12 shows a perspective view of an outer vortex flow according to embodiments of the present disclosure.

FIG. 11 shows a cross sectional view of a plasma chamber 222 according to embodiments of the present disclosure. FIG. 12 shows a perspective view of an outer vortex flow 245 according to embodiments of the present disclosure. As depicted, the plasma chamber 222 is similar to the plasma chamber 22 in FIG. 2, with the difference that the plasma chamber 222 does not include any forward flow inlet. As such, the plasma chamber 222 generates only the outer vortex flow 245 inside the plasma cavity, where the outer vortex flow 245 includes the inner downward flow region 245-1 and outer upward flow region 245-2.

As depicted, a plasma 246 is sustained inside the outer vortex flow 245, more specifically, the inner downward flow portion 245-1 of the outer vortex flow 245. In embodiments, the plasma 246 processes/reforms the gas particles in the inner downward flow portion 245-1 of the outer vortex flow 245 and the reformed gas exits the gas outlet formed in the reverse flow inlet 244.

In embodiments, the height (i.e. the length along the y-axis) of the plasma stabilizer 238 affects the height of the outer vortex flow 245. Whilst not being bound by theory, the plasma stabilizer 238 appears to suppress the fluctuation of the flow regime in the plasma cavity, to thereby stabilize the outer vortex flow 245 and the plasma 246 formed inside the outer vortex flow 245.

Figure 13:
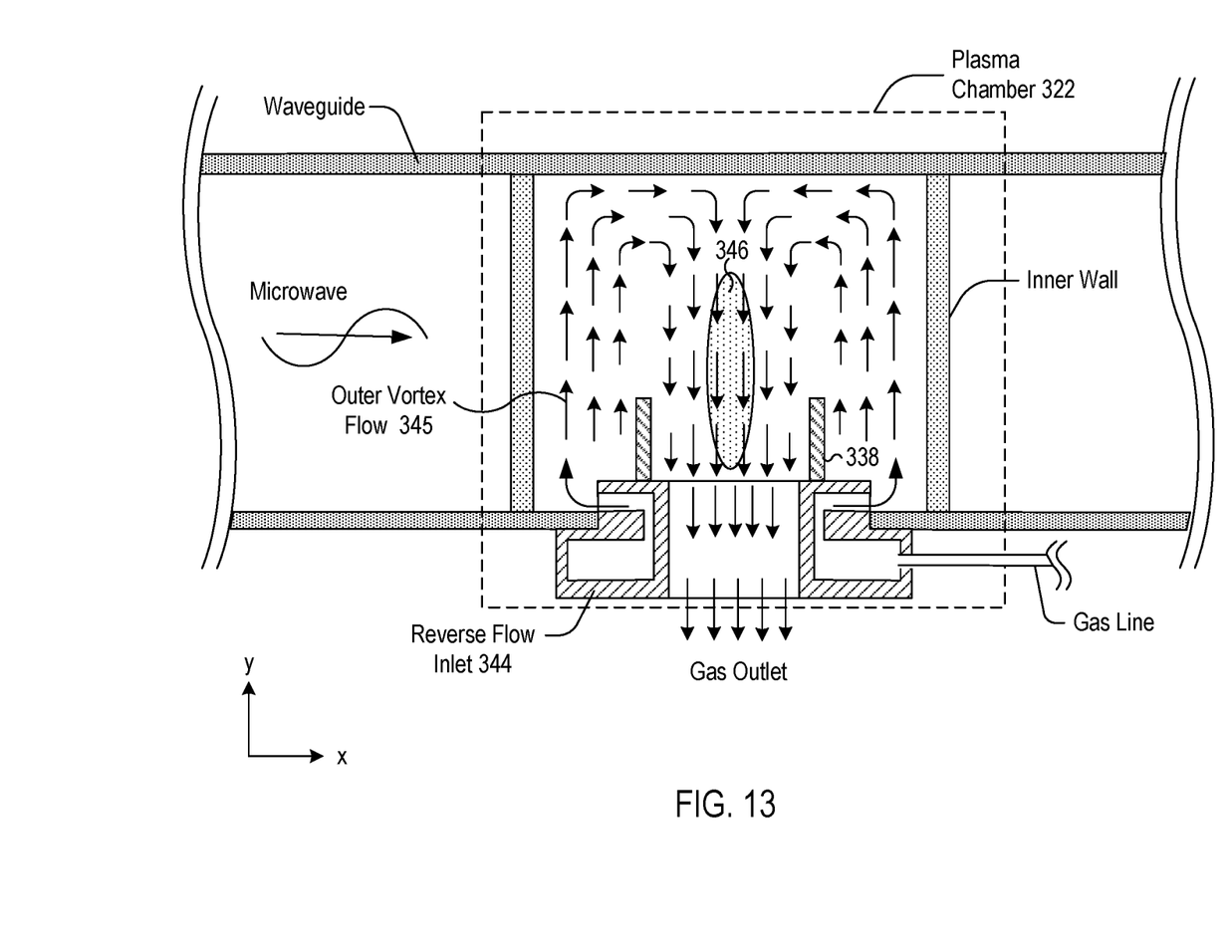
FIG. 13 shows a cross sectional view of a plasma chamber according to embodiments of the present disclosure.

FIG. 13 shows a cross sectional view of a plasma chamber 322 according to embodiments of the present disclosure. As depicted, the plasma chamber 322 is similar to the plasma chamber 122 in FIG. 9, with the difference that the plasma chamber 322 does not include any forward flow inlet. In embodiments, the plasma stabilizer 338 is located inside the outer vortex flow 345 that is similar to the outer vortex flow 245, and preferably separates the inner upward flow region (similar to 245-1) of the outer vortex flow 345 from the outer downward flow region (similar to 245-2) of the outer vortex flow 345, i.e., the plasma stabilizer 338 is located at the boundary between the inner and outer flow regions of the outer vortex flow 345.

In embodiments, the plasma stabilizer 338 is located inside the outer vortex flow 345 and suppresses the fluctuation of the radial dimension of the inner upward flow region of the outer vortex flow 345 during operation, to thereby stabilize the overall flow regime of the outer vortex flow 345 and, in turn, stabilize the plasma 346.

Figure 14A:
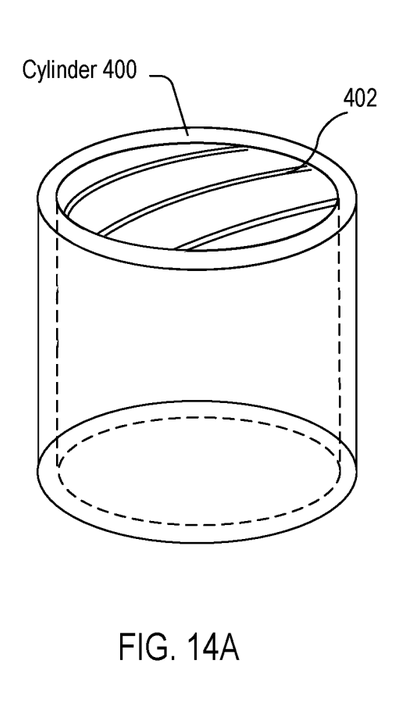
FIG. 14A shows a perspective view of a hollow cylinder according to embodiments of the present disclosure.

In embodiments, the vortical motion of the inner and outer vortex flows in FIGS. 1-13 enhances the stability of the flow regimes in the plasma cavities. In embodiments, one or more of the components in the plasma chambers in FIGS. 1-13 may be rifled or finned to further impart vortical motion to the vortex flows. For instance, the outer vortex flow 45 is in direct contact with the inner surface of the inner wall 40, and as such, the inner surface of the inner wall 40 may be rifled or finned to impart helical motion to the outer vortex flow. In another example, the plasma stabilizer 38 is in direct contact with the inner vortex flow 43, and as such, the inner surface of the plasma stabilizer 38 may be rifled or finned to impart helical motion to the inner vortex flow. FIG. 14A shows a perspective view of a hollow cylinder 400 according to embodiments of the present disclosure. As depicted the inner surface of the hollow cylinder 400 includes one or more groves (or fins) 402 to impart helical motion to the gas as the gas flows along the inner surface of the cylinder. In embodiments, the cylinder 400 may be used as the plasma stabilizers and/or the inner walls in FIG. 1-13.

Figure 14B:
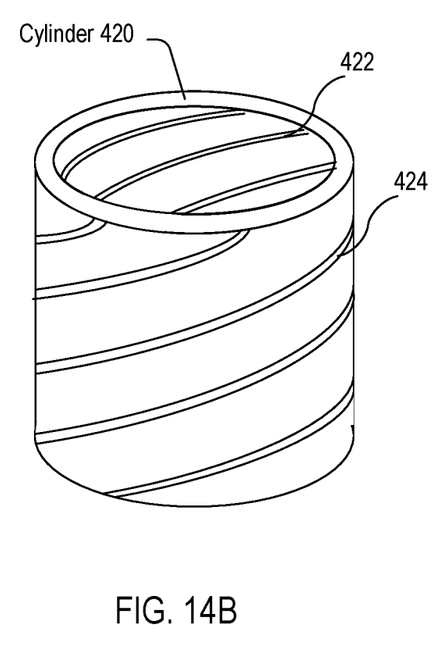
FIG. 14B shows a perspective view of a hollow cylinder according to embodiments of the present disclosure.

In embodiments, the plasma stabilizer (e.g. 338) is located inside the outer vortex flow (e.g. 345) and as such, both the inner and outer surfaces of the plasma stabilizer 338 may be rifled or finned to further impart helical motion to the outer vortex flow 345. FIG. 14B shows a perspective view of a hollow cylinder 420 according to embodiments of the present disclosure. As depicted, both the inner and outer surfaces of the hollow cylinder 420 include one or more groves (or fins) 422 to impart helical motion to the gas as the gas flows along the inner and/or outer surface of the cylinder. In embodiments, the cylinder 420 may be used as the plasma stabilizers and/or the inner walls in FIG. 1-13.

One skilled in the art will recognize no computing system or programming language is critical to the practice of the present disclosure. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A plasma generating system, comprising:
   a waveguide for transmitting a microwave energy therethrough;
   an inner wall disposed within the waveguide to define a plasma cavity, a plasma being generated within the plasma cavity using the microwave energy;
   a first flow inlet mounted on a bottom side of the waveguide and including one or more passageways through which a first gas is introduced into the plasma cavity and configured to generate a first vortex flow within the plasma cavity using the first gas, the first flow inlet having a through hole through which a gas that is processed by the plasma and moves toward the bottom side of the waveguide exits the plasma cavity; and
   a plasma stabilizer having a shape of a circular hollow cylinder and installed on a a top side of the waveguide and protruding into the plasma cavity, a longitudinal direction of the plasma stabilizer being parallel to a rotational axis of the first vortex flow,
   wherein the one or more passageways of the first flow inlet are disposed on the bottom side of the waveguide.

2. The plasma generating system as recited in claim 1, wherein the inner wall is formed of a material that is transparent to the microwave energy.

3. The plasma generating system as recited in claim 1, wherein the first vortex flow has an outermost region that is in direct contact with the inner wall while the outermost region proceeds toward the top side of the waveguide in a helical motion and an inner region that proceeds toward the bottom side of the waveguide in a helical motion and wherein the plasma is generated in the inner region of the first vortex flow.

4. The plasma generating system as recited in claim 1, wherein each of the one or more passageways is arranged to impart a vortical motion to the first gas that passes therethrough.

5. The plasma generating system as recited in claim 1, further comprising:
   a second flow inlet mounted on the top side of the waveguide and configured to introduce a second gas toward the plasma stabilizer,
   wherein the second flow inlet is configured to generate a second vortex flow within the plasma cavity using the second gas.

6. The plasma generating system as recited in claim 5, wherein the second vortex flow is located inside the first vortex flow and the plasma is generated in the second vortex flow.

7. The plasma generating system as recited in claim 5, wherein the second flow inlet includes one or more passageways through which the second gas flows and each of the one or more passageways is arranged to impart a vortical motion to the second gas that passes therethrough.

8. The plasma generating system as recited in claim 5, wherein a flow rate of the second gas ranges 5-95% by mass of a total flow rate of gas flowing into the plasma cavity.

9. The plasma generating system as recited in claim 1, wherein at least one of the inner wall and the plasma stabilizer has a surface that is rifled to impart helical motion to a gas that is in contact with the surface.

10. A plasma generating system, comprising:
    a waveguide for transmitting a microwave energy therethrough;
    an inner wall disposed within the waveguide to define a plasma cavity, a plasma being generated within the plasma cavity using the microwave energy;
    a first flow inlet mounted on a bottom side of the waveguide and including one or more passageways through which a first gas is introduced into the plasma cavity and configured to generate a first vortex flow within the plasma cavity using the first gas, the first flow inlet having a through hole through which a gas that is processed by the plasma and moves toward the bottom side of the waveguide exits the plasma cavity; and
    a plasma stabilizer having a shape of a circular hollow cylinder and installed on the first flow inlet, a longitudinal direction of the plasma stabilizer being in parallel to a rotational axis of the first vortex flow,
    wherein the one or more passageways of the first flow inlet are disposed on the bottom side of the waveguide.

11. The plasma generating system as recited in claim 10, wherein the inner wall is formed of a material that is transparent to the microwave energy.

12. The plasma generating system as recited in claim 10, wherein the first vortex flow has an outermost region that is in direct contact with the inner wall while the outermost region proceeds toward a top side of the waveguide in a helical motion and an inner region that proceeds toward the bottom side of the waveguide in a helical motion and wherein the plasma is generated in the inner region of the first vortex flow.

13. The plasma generating system as recited in claim 10, wherein the first vortex has an outermost region that is in direct contact with the inner wall while the outermost region proceeds toward the top side of the waveguide in a helical motion and an inner region that proceeds toward the bottom side of the waveguide in a helical motion and wherein the plasma stabilizer is located at a boundary between the inner and outer regions of the first vortex.

14. The plasma generating system as recited in claim 10, wherein each of the one or more passageways is arranged to impart a vortical motion to the first gas that passes therethrough.

15. The plasma generating system as recited in claim 10, further comprising:
   a second flow inlet mounted on the top side of the waveguide and configured to introduce a second gas toward the plasma stabilizer,
   wherein the second flow inlet is configured to generate a second vortex flow within the plasma cavity using the second gas.

16. The plasma generating system as recited in claim 15, wherein the second vortex flow is located inside the first vortex flow and the plasma is generated in the second vortex flow.

17. The plasma generating system as recited in claim 15, wherein the second vortex flow is disposed in the first vortex flow.

18. The plasma generating system as recited in claim 15, wherein the second flow inlet includes one or more passageways through which the second gas flows and each of the one or more passageways is arranged to impart a vortical motion to the second gas that passes therethrough.

19. The plasma generating system as recited in claim 10, wherein a flow rate of the second gas ranges 5-95% by mass of a total gas flow rate into the plasma cavity.

20. The plasma generating system as recited in claim 10, wherein at least one of the inner wall and the plasma stabilizer has a surface that is rifled to impart helical motion to a gas that is in contact with the surface.

\* \* \* \* \*